(12) United States Patent
Lin et al.

(10) Patent No.: US 8,299,876 B2
(45) Date of Patent: Oct. 30, 2012

(54) FILTER

(75) Inventors: Pei-Yang Lin, Taipei (TW);
Chih-Chung Lin, Taipei (TW);
Wen-Lin Yang, Taipei (TW)

(73) Assignee: ASUSTeK COMPUTER Inc., Taipei (TW)

( * ) Notice: Subject to any disclaimer, the term of this patent is extended or adjusted under 35 U.S.C. 154(b) by 349 days.

(21) Appl. No.: 12/704,529

(22) Filed: Feb. 12, 2010

(65) Prior Publication Data
US 2010/0214039 A1 Aug. 26, 2010

(30) Foreign Application Priority Data
Feb. 23, 2009 (TW) .............................. 98105655 A

(51) Int. Cl.
*H01P 1/203* (2006.01)
*H03H 7/38* (2006.01)

(52) U.S. Cl. .......................................... 333/204; 333/35
(58) Field of Classification Search ................... 333/4, 5, 333/12, 204, 35
See application file for complete search history.

(56) References Cited

U.S. PATENT DOCUMENTS

| | | | | | |
|---|---|---|---|---|---|
| 4,074,214 | A * | 2/1978 | Aichholzer | ................... | 333/204 |
| 5,025,235 | A | 6/1991 | Pramanick | | |
| 5,321,375 | A * | 6/1994 | Corman | ........................ | 333/246 |
| 6,194,981 | B1 * | 2/2001 | Henderson et al. | ........... | 333/204 |
| 6,677,839 | B2 * | 1/2004 | Aruga | ............................ | 333/246 |
| 7,224,180 | B2 * | 5/2007 | Hargrove et al. | ............... | 326/30 |
| 7,812,693 | B1 * | 10/2010 | Acimovic | ...................... | 333/204 |
| 7,872,606 | B1 * | 1/2011 | Cheng | .................... | 343/700 MS |
| 2007/0268088 | A1 * | 11/2007 | Singh | .............................. | 333/33 |

FOREIGN PATENT DOCUMENTS

| | | |
|---|---|---|
| CN | 1819330 | 8/2006 |
| TW | I247448 | 1/2006 |
| TW | I266567 | 11/2006 |

* cited by examiner

*Primary Examiner* — Seungsook Ham
(74) *Attorney, Agent, or Firm* — Jianq Chyun IP Office

(57) ABSTRACT

A filter for filtering noise generated by a differential signal having a specific wavelength transmitted by a first transmission line and a second transmission line is disclosed. The filter includes a multi-layer substrate, a first microstrip line and a second microstrip line. The first and the second transmission lines and the first and the second microstrip lines are disposed at the multi-layer substrate. In addition, one end of the first microstrip line and one end of the second microstrip line are electrically connected to the first and the second transmission lines, respectively, by passing through the vias, and the other end is in a floating state. The impedances of the first and the second microstrip lines match the impedances of the first and the second transmission lines, respectively. Thus, the first and the second microstrip lines may filter the noise generated by the differential signal having the specific wavelength.

8 Claims, 5 Drawing Sheets

140
FILTER

CROSS-REFERENCE TO RELATED APPLICATION

This application claims the priority benefit of Taiwan application serial no. 98105655, filed Feb. 23, 2009. The entirety of the above-mentioned patent application is hereby incorporated by reference herein and made a part of specification.

BACKGROUND OF THE INVENTION

1. Filed of the Invention

The invention relates to a filter and, more particularly, to a filter which does not includes a capacitor, an inductance or a resistor.

2. Description of the Related Art

In evaluation criteria of various electronic devices, to audio/video household electrical appliances such as a personal computer, a television or a stereo, electromagnetic compatibility (EMC) is a key index of quality. In the developed countries nowadays, the evaluation report of the EMC is more and more important. Since the transmitting speed of a signal in the electronic device is faster and faster, the electromagnetic interference (EMI) generated by electronic elements disposed in the electronic device is more and more serious. Thus, the normal operation of the electronic device is affected.

The EMC evaluation includes the electromagnetic interference (EMI) evaluation and the electromagnetic susceptibility (EMS) evaluation. The EMI may be transmitted in a conducting mode and a radiating mode, and the radiated EMI problem should be solved by changing the wiring or the disposing mode of the elements. In the conventional technology, to reduce the affection of the EMI, designers usually add various filters such as a low pass filter, a high pass filter, a π-shaped filter and a band pass filter to reduce the EMI in the circuit.

In an actual architecture, passive elements such as a capacitor, a resistor or an inductor are usually used to form the filter in the conventional technology. However, the capacitor, the resistor and other passive elements not only consume the layout space of the electronic device, but also limit the micromation development of the electronic devices. Thus, how to improve the quality of the electronic device with considering the layout area of the electronic device becomes an important subject on filter design nowadays.

BRIEF SUMMARY OF THE INVENTION

The invention discloses a filter for filtering noise generated by a differential signal having a specific wavelength and improving the quality of electronic devices.

The invention also discloses a filter for filtering noise generated by a differential signal having a specific wavelength and promoting the micromation of the electronic devices.

In an embodiment of the invention, the filter is used to filter noise generated by the differential signal having the specific wavelength transmitted by the first transmission line and the second transmission line, and it includes a multi-layer substrate, a first microstrip line and a second microstrip line. The multi-layer substrate is used to carry the first transmission line and the second transmission line, and the first microstrip line and the second microstrip line are disposed at the multi-layer substrate.

In addition, one end of the first microstrip line is electrically connected to the first transmission line through a first via, and the other end is in a floating state. Similarly, one end of the second microstrip line is electrically connected to the second transmission line through a second via, and the other end is in a floating state. Besides, the impedances of the first microstrip line and the second microstrip line match the impedances of the first transmission line and the second transmission line, respectively. Thus, the first microstrip line and the second microstrip line may filter the noise generated by the differential signal having the specific wavelength.

In an embodiment of the invention, the maximum length of the first microstrip line is a quarter of the specific wavelength, and the maximum length of the second microstrip line is a quarter of the specific wavelength. In addition, the first transmission line is parallel with the second transmission line, and the minimum distance between the first microstrip line and the second microstrip line is not less than the distance between the first transmission line and the second transmission line.

The invention also discloses a filter for filtering noise generated by the differential signal having the specific wavelength transmitted by a first transmission line and the second transmission line, and the filter includes a multi-layer substrate, a first microstrip line and a second microstrip line. The first transmission line, the second transmission line, the first microstrip line and the second microstrip line are disposed at the first signal layer of the multi-layer substrate.

In addition, one end of the first microstrip line is electrically connected to the first transmission line, and the other end is in a floating state. One end of the second microstrip line is electrically connected to the second transmission line, and the other end is in a floating state. In addition, the impedances of the first microstrip line and the second microstrip line match the impedances of the first transmission line and the second transmission line, respectively. Thus, the first microstrip line and the second microstrip line may filter the noise generated by the differential signal having the specific wavelength.

In an embodiment of the invention, the maximum length of the first microstrip line is a quarter of the specific wavelength, and the maximum wavelength of the second microstrip line is a quarter of the specific wavelength. In addition, the first transmission line is parallel with the second transmission line, and the minimum distance between the first microstrip line and the second microstrip line is not less than the distance between the first transmission line and the second transmission line.

In the invention, a first microstrip line and a second microstrip line of the first transmission line and the second transmission line are electrically connected to each other to filter the noise generated by the differential signal having a specific wavelength. In addition, compared with the conventional technology, the filter in the invention does not need passive elements such as a capacitor or a resistor to reach a filtering effect. Thus, the filter in the invention may reduce the signal drift, and it may improve the quality of the electronic devices and prompt the micromation process.

These and other features, aspects and advantages of the present invention will become better understood with regard to the following description, appended claims, and accompanying drawings.

DETAILED DESCRIPTION OF THE EMBODIMENTS

Figure 1:
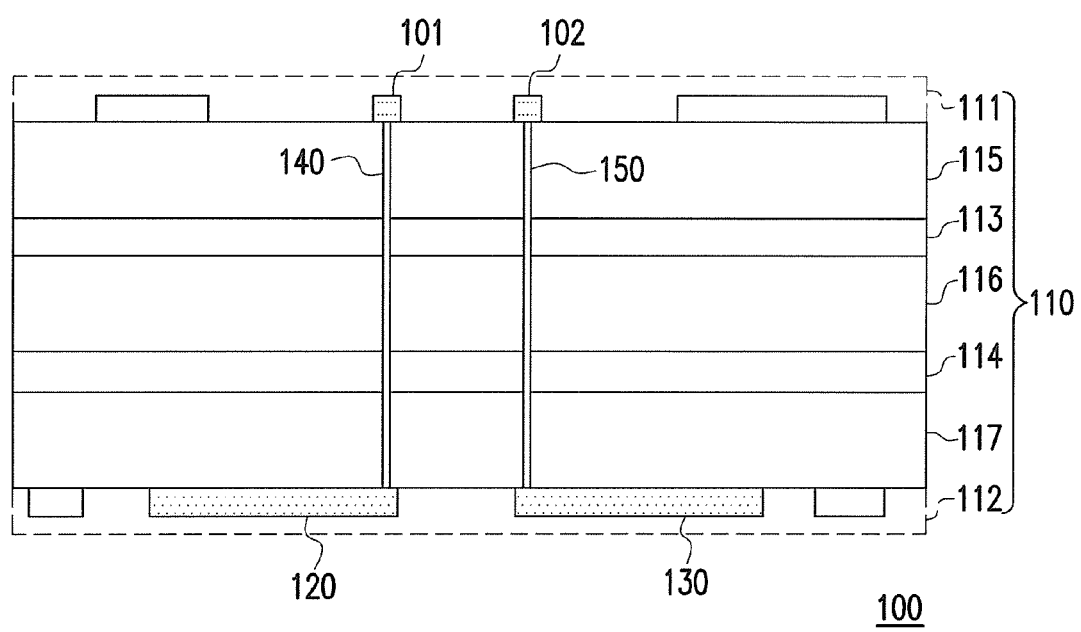
FIGS. 1 and 1A are sectional diagrams showing the filter according to embodiments of the invention respectively.
Figure 2A:
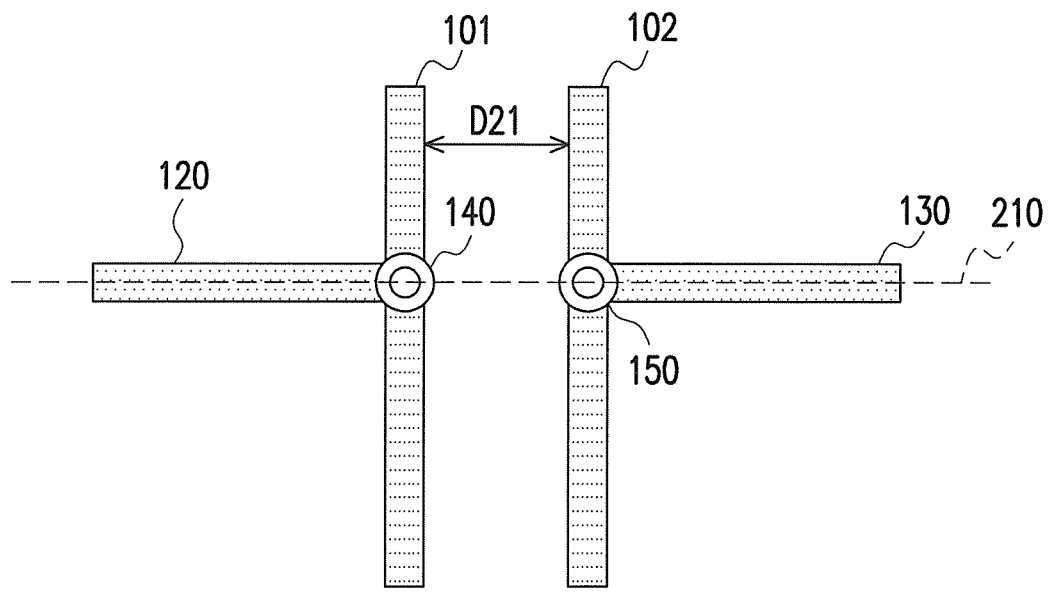
FIG. 2A is a schematic diagram showing the structures of parts of the filter projected on the same plane.

FIG. 1 is a sectional diagram showing the filter according to an embodiment of the invention. FIG. 2A is a schematic diagram showing the structures of parts of the filter projected on the same plane. As shown in FIG. 1 and FIG. 2A, the transmission lines 101 and 102 transmit the differential signal having a specific wavelength together. In addition, the filter 100 includes a multi-layer substrate 110, a microstrip line 120 and a microstrip line 130.

Furthermore, the multi-layer substrate 110 includes multiple signal layers 111 to 114 and multiple dielectric layers 115 to 117. The signal layers 111 to 114 are stacked with the dielectric layers 115 to 117 alternately, and the signal layers 111 and 112 are located at the outer sides of the multi-layer substrate 110, respectively.

In actual configuration, the transmission line 101 and the transmission line 102 are disposed at the signal layer 111 of the multi-layer substrate 110. The microstrip line 120 and the microstrip line 130 are disposed at the signal layer 112 of the multi-layer substrate 110. In addition, one end of the microstrip line 120 is electrically connected to the transmission line 101 through a via 140, and the other end is in a floating state. Similarly, one end of the microstrip line 130 is electrically connected to the transmission line 102 through the via 150, and the other end is in a floating state.

Figure 1A:
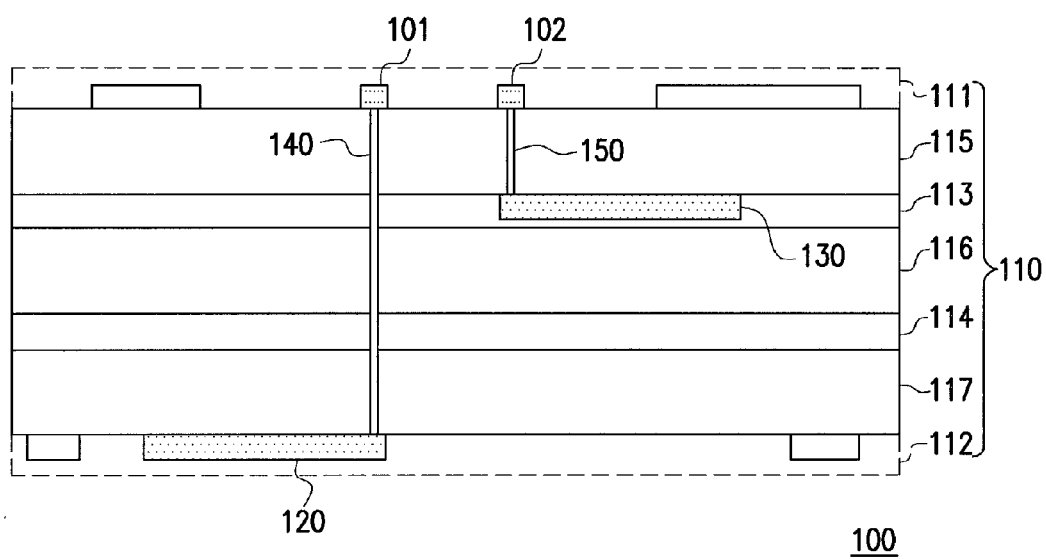

Although the configuration position of the microstrip line is given out in the embodiment, a skilled person in the art may change the disposing position according to the requirements. For example, as shown in FIG. 1A, the microstrip line 120 and the microstrip line 130 may be disposed at different signal layers 112 and 113, respectively. In addition, the signal layers which do not have transmission lines 101 and 102 and the microstrip lines 120 and 130 may be power layers or ground layers, respectively.

Furthermore, the impedance of the microstrip line 120 matches that of the transmission line 101, and the impedance of the microstrip line 130 matches that of the transmission line 102. For example, when the impedances of the transmission line 101 and the transmission line 102 are 50 ohms, the impedances of the microstrip line 120 and the microstrip line 130 are 50 ohms. Correspondingly, when the impedances of the transmission line 101 and the transmission line 102 are 70 ohms, the impedances of the microstrip line 120 and the microstrip line 130 are 70 ohms.

Thus, when the transmission line 101 and the transmission line 120 transmit the differential signals, the microstrip line 120 and the microstrip line 130 may filter the noise generated by the differential signal having the specific wavelength. In addition, in the embodiment, the lengths of the microstrip line 120 and 130 are a quarter of the specific wavelength. The filter 100 may achieve the filtering effect without passive elements such as a capacitor, a resistor and an inductor. Thus, the quality of the electronic device is improved, and the micromation development is promoted.

FIG. 2A shows the relative positions of the transmission line 101, the transmission line 102, the microstrip line 120 and the microstrip line 130 in actual configuration in detail.

The transmission line 101 and the transmission line 102 are parallel with each other. The microstrip line 120 and the microstrip line 130 are located at the same horizontal line 210, and the minimum distance between the microstrip line 120 and the microstrip line 130 equals to distance D21 between the transmission line 10a and the transmission line 102.

Although the relative positions of the microstrip lines 120 and 130 are given out, the invention is not limited thereto. In actual application, the microstrip lines 120 and 130 may be selectively located at a same horizontal line, and a skilled person in the art may change the disposing positions of the microstrip line 120 and the microstrip line 130 on the premise that the minimum distance between the microstrip line 120 and the microstrip line 130 is not less than the distance D21 between the transmission line 101 and the transmission line 102.

Figure 2B:
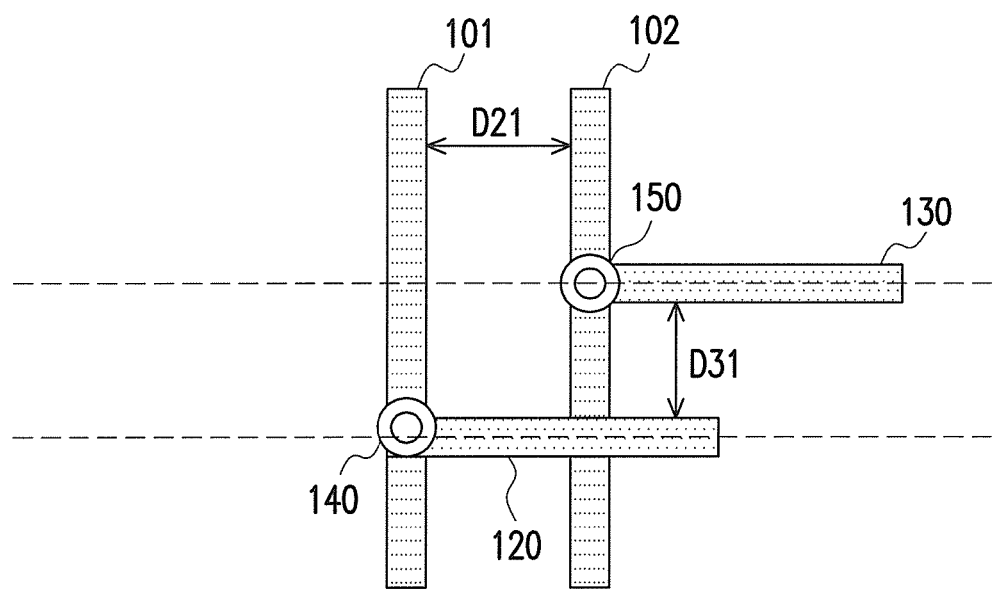
FIG. 2B is a disposing diagram showing the microstrip line according to another embodiment of the invention.

For example, FIG. 2B is a disposing diagram showing the microstrip line according to another embodiment of the invention. The microstrip line 120 is parallel with the microstrip line 130, and the minimum distance D31 between the microstrip line 120 and the microstrip line 130 which is also the distance between the microstrip line 120 and the microstrip line 130 is larger than or equal to the distance D21. In addition, since one end of the microstrip line 120 and one end of the microstrip line 130 are connected to the via 140 and the via 150, respectively, in designing the disposing positions of the microstrip line 120 and the microstrip line 130, the disposing positions of the via 140 and the via 150 are determined.

Figure 3:
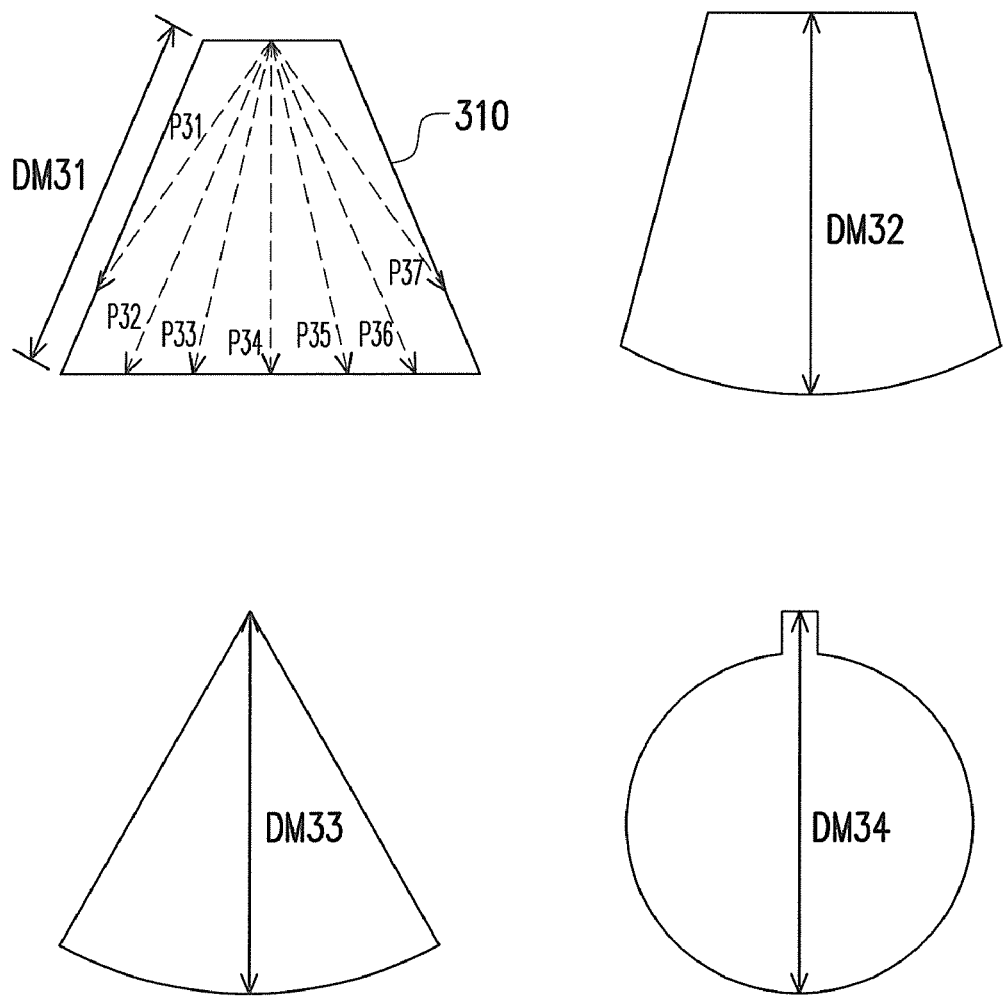
FIG. 3 is a schematic diagram showing the shape of the microstrip line in the embodiment of FIG. 1.

In addition, as shown in FIG. 3, besides rectangle in FIG. 2A and FIG. 2B, the microstrip lines 120 and 130 may have other shapes such as trapezoid type, sector or round. In addition, regardless of the shapes of the microstrip lines 120 and 130, the maximum length (such as the distance DM31, DM32, DM 33 and DM 34) is a quarter of the specific wavelength. In addition, in actual application, the rectangle microstrip lines 120 and 130 only may filter the noise having single frequency, and they are adapted to a noise environment with a narrow band.

In another aspect, the trapezoid type, sector or round microstrip line may form multiple current paths during signal transmission, and the lengths of the current paths may vary with the shape of the microstrip line. For example, as shown in the trapezoid type-shaped microstrip line 310 in FIG. 3, the multiple current paths P31 to P37 may be changed in lengths according to the shape of the microstrip line 310. Thus, the trapezoid type, the sector or the round microstrip line may filter the noise having different frequency, and thus it is adapted to the noise environment with a broad band.

Figure 4:
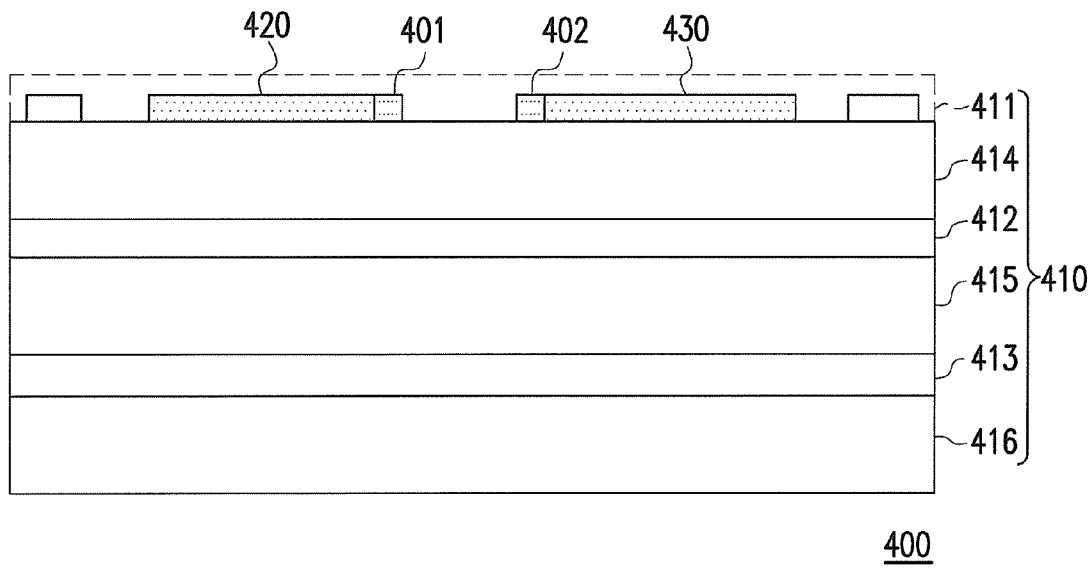
FIG. 4 is a sectional diagram showing the filter in another embodiment of the invention.
Figure 5:
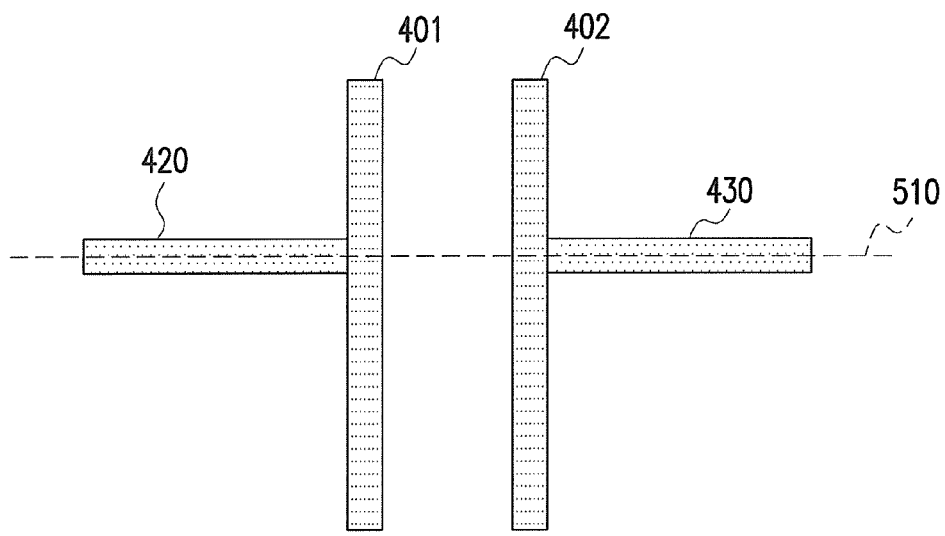
FIG. 5 is a top view of the filter in FIG. 4.

FIG. 4 is a sectional diagram showing the filter in another embodiment of the invention, and FIG. 5 is a top view of the filter in FIG. 4. As shown in FIG. 4 and FIG. 5, the transmission line 401 and 402 are used to transmit the differential signal having the specific wavelength. In addition, the filter 400 includes a multi-layer substrate 410, a microstrip line 420 and a microstrip line 430.

As shown in FIG. 4, the multi-layer substrate 410 includes multiple signal layers 411 to 413 and multiple dielectric layers 414 to 416. The signal layers 411 to 413 are stacked with the dielectric layers 414 to 416 alternately, and the signal layer 411 is located at the outer side of the multi-layer substrate 410. In addition, the signal layers 412 and 413 may be ground layer and power layer, respectively.

In actual configuration, the transmission line 401, the transmission line 402, the microstrip line 420 and the microstrip line 430 are disposed in the signal layer 411 of the multi-layer substrate 410. In addition, one end of the microstrip line 420 is electrically connected to the transmission line 401, and the other end is in a floating state. Similarly, one end of the microstrip line 430 is electrically connected to the transmission line 402, and the other end is in a floating state.

The impedance of the microstrip line 420 matches that of the transmission line 401, and the impedance of the microstrip line 430 matches that of the transmission line 402. Thus, when the transmission line 401 and the transmission line 402 transmit the differential signals, the microstrip line 420 and the microstrip line 430 may filter the noise generated by the differential signal having the specific wavelength. In addition, in the embodiment, the lengths of microstrip line 420 and the microstrip line 430 are a quarter of the specific wavelength.

FIG. 5 shows the relative positions of the transmission line 401, the transmission line 402, the microstrip line 420 and the microstrip line 430. The transmission line 401 and the transmission line 402 are parallel with each other, and the microstrip line 420 and the microstrip line 430 are located at the same horizontal line 510. In addition, the microstrip line 420 and the microstrip line 430 are respectively disposed at sides of the transmission line 401 and the transmission line 402, and the two sides are not adjacent to each other.

A skilled person in the art may change the position of the microstrip lines 420 and 430 on the premise that they are located at the sides of the transmission lines 401 and 402 which are not adjacent to each other. In addition, besides rectangle, the shapes of the microstrip line 420 and 430 also may be trapezoid type, sector or round as shown in FIG. 3.

To sum up, in the invention, two microstrip lines which are electrically connected to two transmission lines are used to filter the differential signal having a specific wavelength. Thus, in the filter of the invention, passive elements such as a capacitor, a resistor and an inductor are not needed, and the filtering effect is achieved. Therefore, the filter in the invention may reduce the signal distortion, and it improves the quality of the electronic devices and promotes the micromation of the electronic devices.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A filter for filtering noise generated by a differential signal having a specific wavelength transmitted by a first transmission line and a second transmission line together, the filter comprising:
   a multi-layer substrate for carrying the first transmission line and the second transmission line;
   a first microstrip line disposed at the multi-layer substrate, one end of the first microstrip line is electrically connected to the first transmission line through a first via; and
   a second microstrip line disposed at the multi-layer substrate, one end of the second microstrip line is electrically connected to the second transmission line through a second via;
   wherein the impedances of the first microstrip line and the second microstrip line match the impedances of the first transmission line and the second transmission line, respectively, the maximum length of the first microstrip line is a quarter of the specific wavelength, and the maximum length of the second microstrip line is a quarter of the specific wavelength.

2. The filter according to claim 1, wherein the first transmission line and the second transmission line are disposed at a first signal layer of the multi-layer substrate, and the first microstrip line and the second microstrip line are disposed at a second signal layer of the multi-layer substrate.

3. The filter according to claim 2, wherein the multi-layer substrate further comprises a third signal layer and multiple dielectric layers, and the first signal layer to the third signal layer are stacked with the dielectric layers alternately.

4. The filter according to claim 1, wherein the first transmission line and the second transmission line are disposed at a first signal layer of the multi-layer substrate, and the first microstrip line and the second microstrip line are disposed at a second signal layer and a third signal layer of the multi-layer substrate, respectively.

5. The filter according to claim 4, wherein the multi-layer substrate further comprises a fourth signal layer and multiple dielectric layers, and the first signal layer to the fourth signal layer are stacked with the multiple dielectric layers alternately.

6. The filter according to claim 1, wherein the first transmission line is parallel with the second transmission line.

7. The filter according to claim 6, wherein the minimum distance between the first microstrip line and the second microstrip line is not less than the distance between the first transmission line and the second transmission line.

8. The filter according to claim 1, wherein the shapes of the first microstrip line and the second microstrip line are rectangle, trapezoid type, circular sector or round.

* * * * *